(12) United States Patent
Wang et al.

(10) Patent No.: US 6,362,041 B1
(45) Date of Patent: Mar. 26, 2002

(54) METHOD AND STRUCTURE FOR STACKED DRAM CAPACITORS AND FETS FOR EMBEDDED DRAM CIRCUITS

(75) Inventors: Chen-Jong Wang; Dennis J. Sinitsky, both of Hsin-chu (TW)

(73) Assignee: Taiwan Semiconductor Manufacturing Company, Hsin-Chu (TW)

( * ) Notice: Subject to any disclaimer, the term of this patent is extended or adjusted under 35 U.S.C. 154(b) by 0 days.

(21) Appl. No.: 09/596,899

(22) Filed: Jun. 19, 2000

(51) Int. Cl.[7] .......................................... H01L 21/8244
(52) U.S. Cl. ....................................... 438/253; 438/396
(58) Field of Search ................................. 438/239, 240, 438/241, 244, 253, 332, 339, 392, 396, 397, 692

(56) References Cited

U.S. PATENT DOCUMENTS

| | | | |
|---|---|---|---|
| 5,821,139 A | 10/1998 | Tseng | 438/239 |
| 5,930,618 A * | 7/1999 | Sun et al. | 438/240 |
| 5,998,251 A * | 12/1999 | Wu et al. | 438/241 |
| 6,015,732 A | 1/2000 | Williamson et al. | 438/253 |

* cited by examiner

Primary Examiner—David Nelms
Assistant Examiner—David Nhu
(74) Attorney, Agent, or Firm—George O. Saile; Stephen B. Ackerman

(57) ABSTRACT

A method for fabricating stacked DRAM capacitors and FET structures for embedded circuits is achieved. The polysilicon capacitor bottom electrodes are formed first on the substrate in the memory regions. A single thin dielectric layer is formed over the bottom electrodes to serve as the interelectrode layer and concurrently on the device areas in the logic regions for the FET gate oxide. A second polysilicon layer is deposited and patterned to form the capacitor top electrodes and concurrently to form the FET gate electrodes. Next the lightly doped drains and source/drain contact areas are implanted to form FETs. Since the source/drain areas are formed after the DRAM capacitors are completed, the high-temperature thermal cycles for the DRAM capacitors are avoided. Therefore the FETs having shallow diffused junctions are formed without thermal degradation. The method also uses fewer processing steps to achieve these novel merged DRAM structures.

14 Claims, 4 Drawing Sheets

FIG. 1 – Prior Art

US 6,362,041 B1

METHOD AND STRUCTURE FOR STACKED DRAM CAPACITORS AND FETS FOR EMBEDDED DRAM CIRCUITS

BACKGROUND OF THE INVENTION (1) Field of the Invention

This invention relates to semiconductor integrated circuit devices, and more particularly to a structure and method for integrating logic and dynamic random access memory (DRAM) cells. The process is particularly useful for integrating (embedding) high-density memory with logic circuits on the same chip while reducing the processing steps and minimizing thermal cycles that can degrade the logic devices. This is achieved by using a single thin high dielectric layer to form concurrently the field effect transistor (FET) gate oxide and the DRAM stacked capacitor interelectrode dielectric layer.

(2) Description of The Prior Art

Integrated logic and DRAM structures are becoming increasingly important for future product applications. However, the current processing is becoming more difficult and the structures are becoming more complex. In these advanced circuits the logic FETs require shallower diffused junctions and thinner gate oxides to increase performance, while the decreasing size of the DRAM capacitors requires increased capacitance for maintaining an acceptable charge level. Besides the increasing process complexity, an important issue is that the shallow FET logic devices degrade because of the thermal cycles used during the later fabrication of the DRAM capacitors. This problem is best understood with reference to the schematic cross-sectional view of a conventional device having merged high-density memory/logic circuits, as shown in FIG. 1. The portion of the drawing in the left part of FIG. 1 is for the memory and labeled DRAM, while the right side depicts the logic portion. In this approach the N- and P-doped wells 16 and 26, respectively, are formed first in the substrate 10. An N-doped deep well 14 is also formed in the memory area at this time. The field oxide 12, such as a shallow trench isolation is formed next to electrically isolate device areas. The FETs are formed next by growing a gate oxide 27. A polycide layer 31 is deposited and patterned to form the FET gate electrodes 31. In the conventional process, lightly doped source/drains 17($N^-$) are implanted adjacent to the gate electrodes 31. Sidewall spacer 33 are formed by depositing and etching back an insulator. The heavily doped source/drain contact areas 19($N^+$) are formed next by ion implantation. An insulating layer 35 is deposited on which the bit lines 37 are formed, then a second insulating layer 39 is deposited on which is formed the DRAM stacked capacitors 41 (layers 41A, 41B, and 41C). An insulating layer 47 is deposited to electrically insulate the capacitors, and a multilevel of metal interconnections 45, 49, and 53 is formed with interposing insulating layers 47, and 51, and an upper passivation layer 55 to wire up the chip, as shown for the DRAM region in the left portion of FIG. 1 and for the logic region in the right portion.

Unfortunately, in future advanced FET devices, it is necessary to maintain very thin gate oxides and shallow diffused source/drain areas to achieve the necessary performance (switching speeds). The numerous thermal processing cycles (steps) required to form the bit lines and DRAM stacked capacitors preclude the possibility of making FETs with shallow diffused source/drain junctions.

Several methods for making improved embedded or merged DRAM circuits have been reported in the literature. One method for making DRAM capacitors with increased electrode area is described in U.S. Pat. No. 5,821,139 to Tseng. In this method the capacitors are made after the FETs, and therefore cannot circumvent the above problem of excessive thermal cycles. In U.S. Pat. No. 6,015,732 to Williamson et al., a method is described for making a dual gate oxide for integrated circuits. One of the gate oxides also serves as a capacitor interelectrode dielectric layer. However, the capacitor is formed on an insulating layer for I/O applications and Williamson does not describe or address the need for making DRAM capacitors with node contacts on the substrate.

However, there is still a need in the semiconductor industry to provide a cost-effective manufacturing process for making logic circuits with embedded DRAM devices while reducing the thermal cycles for the advanced FETs so as to achieve shallow diffused source/drain junctions required for high-performance circuits.

SUMMARY OF THE INVENTION

It is a principal object of the present invention to make logic circuits with embedded DRAM cells using fewer processing steps.

It is another object of the present invention to achieve the above objective to form the DRAM capacitor prior to forming the logic and DRAM FETs source/drain diffusion, and to thereby minimize the number of thermal cycles that the shallow diffused FETs would be subjected to. This prevents the electrical degradation of the FETs.

Still another object of this invention is to use a single high-dielectric-constant layer as the FET gate oxide to increase logic FET performance and concurrently to increase the charge storage on the stacked DRAM capacitor while reducing the number of process steps.

The method for achieving the above objectives for these improved embedded DRAM/logic circuits starts by providing a semiconductor substrate. Typically the substrate is a $P^-$ doped single-crystal silicon having a <100> crystallographic orientation. A field oxide is formed using shallow trench isolation (STI) to surround and electrically isolate device areas in logic regions and DRAM regions on the substrate. P-doped wells and deep N-doped wells are formed in the memory region device areas by ion implantation. An etch-stop layer, composed of silicon nitride ($Si_3N_4$), is deposited by chemical vapor deposition (CVD) and a disposable first insulating layer composed of CVD silicon oxide ($SiO_2$) is deposited. First contact openings are etched in the first insulating layer and the etch-stop layer to the device areas in the memory regions. Capacitor bottom electrodes are formed in the first openings by depositing a conformal first polysilicon layer and chemically-mechanically polished back to the surface of the first insulating layer. The first insulating layer is selectively removed to the etch-stop layer using a wet etch (i.e., hydrofluoric acid, leaving freestanding cylindrical-shaped capacitor bottom electrodes. The area of the capacitor and therefore the capacitance is determined by the thickness of the first insulating layer. Next the etch-stop layer is selectively removed from the substrate surface using, for example, a phosphoric acid etching solution. N-doped wells and P-doped wells are then implanted in the device areas of the logic regions and include the antipunchthrough implants. A key feature of this invention is to deposit a conformal dielectric layer to form the gate oxide for the FETs and concurrently to form an inter-electrode dielectric layer on the capacitor bottom electrodes. The preferred interelectrode dielectric layer is a silicon oxynitride, tantalum pentoxide, and the like. Next a conformal second polysilicon layer is deposited. The second polysilicon layer is then doped by ion implantation. An additional implant mask and an ion implantation can be used to selectively dope the second polysilicon in the DRAM cell array regions. The second polysilicon layer is patterned to form FET gate electrodes and to define the capacitor top electrodes over the DRAM capacitor bottom electrodes. Lightly doped source/drain areas for the FETs are formed adjacent to the gate electrodes by ion implantation. Sidewall spacers are formed on the sidewalls on the gate electrodes by depositing a conformal insulating layer and anisotropically etching back to the top surface of the patterned second polysilicon layer. Then the FET source/drain contact areas are formed by ion implanting a dopant adjacent to the sidewall spacers. To reduce resistance and to improve electrical conductivity a salicide process is used. The salicide is formed by depositing a refractory metal, such as titanium, and sintering (annealing) to form a silicide on the polysilicon gate electrodes and on the source/drain contact areas. The unreacted refractory metal on the insulating surfaces (sidewall spacers and STI) is removed by selective etching. A second insulating layer is deposited and planarized to form an interlevel dielectric layer. Second contact openings are etched in the second insulating layer to the substrate including the FET gate electrodes and source/drain contact areas. Metal plug contacts, such as tungsten, are formed in the second openings and conventional processing can be used to complete the multilevel of metal interconnections necessary to complete the logic/embedded DRAM integrated circuits.

BRIEF DESCRIPTION OF THE DRAWINGS

The above objects and advantages of this invention are best understood with reference to the attached drawings in the figures.

DESCRIPTION OF THE PREFERRED EMBODIMENT

The method for making these logic circuits with embedded DRAM devices is now described in detail. The invention utilizes a process sequence for making the capacitor structure while concurrently forming the FETs for both the logic and memory regions. This results in fewer thermal cycles for forming the FETs and therefore results in shallower diffused source/drain junctions for these advanced FETs. This method utilizes fewer masking steps and reduces process complexity.

Figure 1:
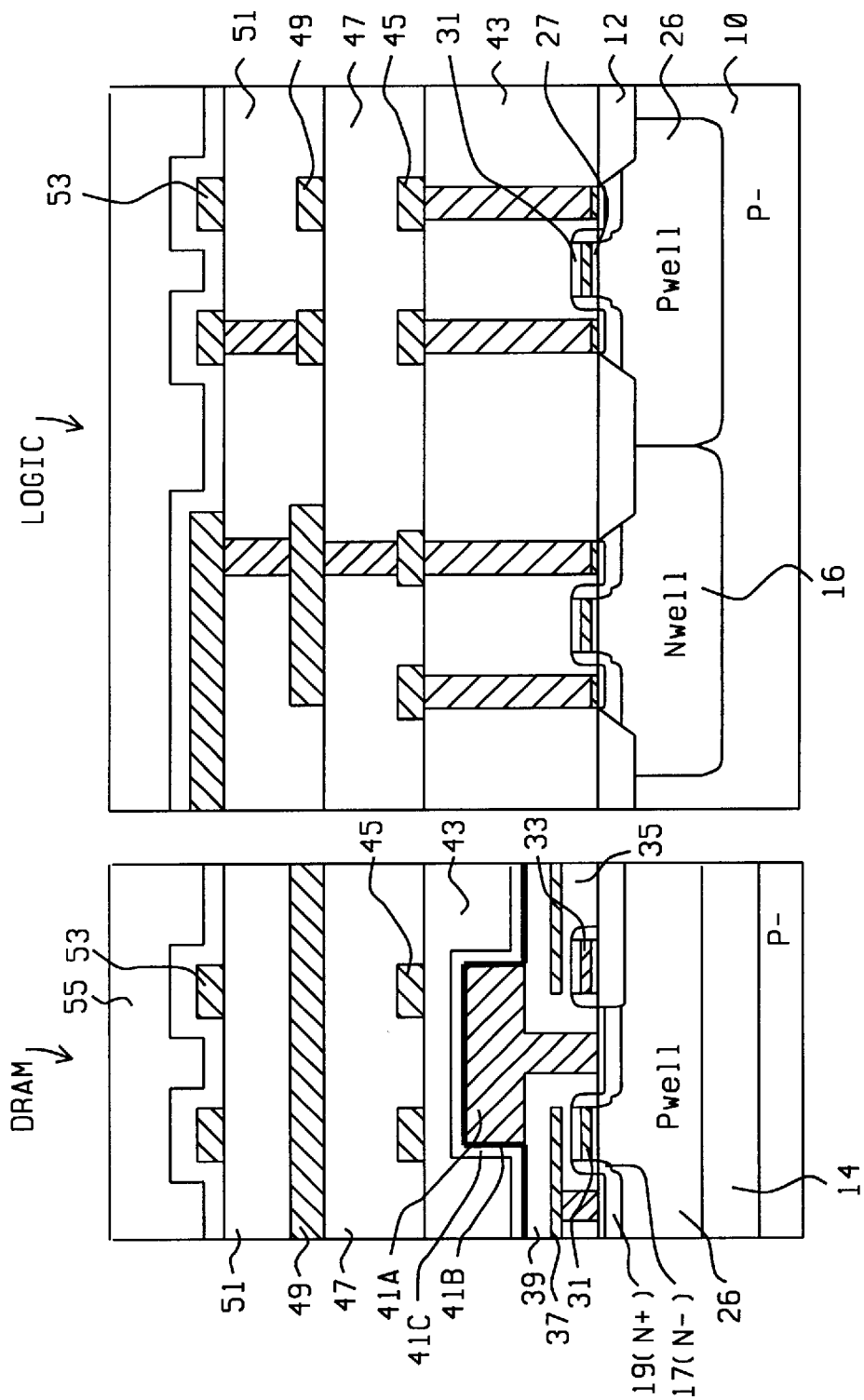
FIG. 1 is a schematic cross-sectional view showing a logic circuit with an embedded DRAM device using a conventional method that depicts the limitations of forming a stacked capacitor over a completed FET.
Figure 2:
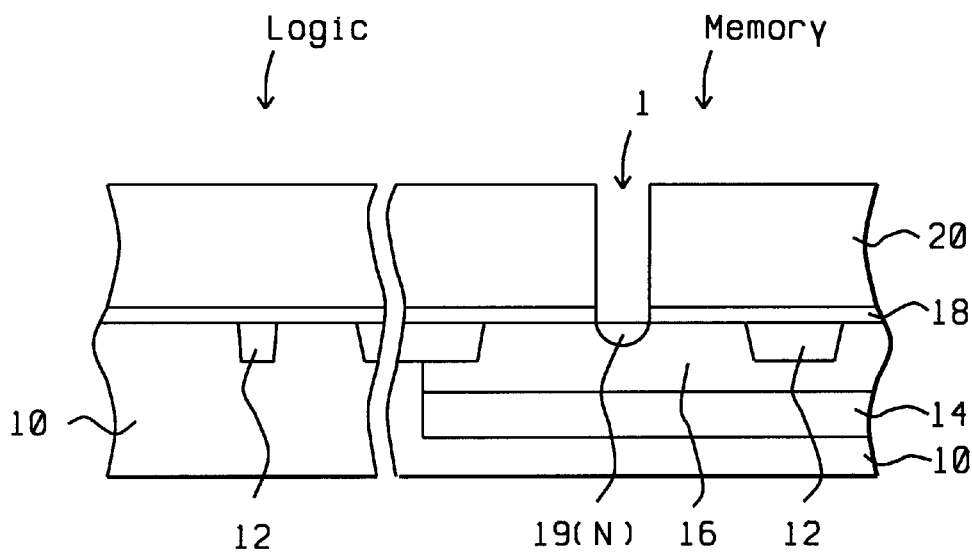
FIGS. 2 through 7 are schematic cross-sectional views showing the sequence of process steps for making a logic circuit with an embedded DRAM device by the method of this invention that reduces the thermal cycles for the FETs and simplifies processing.

Referring now to FIG. 2, the method begins by providing a semiconductor substrate 10, a portion of which is shown in the Figs. The figures show schematic cross-sectional views of the substrate having on the left a region labeled "Logic" for logic circuits, and on the right a region labeled "Memory" for DRAM circuits. For practical reasons, only a single DRAM cell having a stacked capacitor is depicted of the multitude (billions) of memory cells formed in an array of cells. The preferred substrate 10 used in the industry is a $P^-$ doped single-crystal silicon having a <100> crystallographic orientation. Field oxide regions 12 are formed surrounding and electrically isolating the device areas in both the logic and memory regions. For advanced high-density circuits the preferred field oxide 12 is a Shallow Trench Isolation (STI), as is commonly practiced in the semiconductor industry. Briefly, the STI is formed by etching trenches in the field oxide areas on the substrate to a depth of between about 2500 and 4500 Angstroms. After forming an optional channel-stop implant and a thin thermal oxide in the trenches to provide a good interface and to prevent inversion, the trenches are filled with an insulating material, such as chemical-vapor-deposited silicon oxide ($CVD-SiO_2$). The STI is made planar with the surface of the substrate 10, for example, by using a planarizing etch-back technique or by chemical-mechanical polishing (CMP).

Referring still to FIG. 2, using an implant blockout mask over the logic regions, deep N-doped wells 14 are formed in the memory region device areas by ion implanting phosphorus ions ($p^{31}$) to a final dopant concentration of between about 1.0 E 16 and 1.0 E 17 atoms/cm$^3$ and is typically to a depth of about 20000 to 30000 Angstroms. A second implant is carried out to form P-doped wells 16 and is typically formed by implanting boron ions ($B^{11}$) to a final dopant concentration of between about 1.0 E 17 and 1.0 E 18 atoms/cm$^3$ and is typically to a depth of about 7000 to 10000 Angstroms. Next a blanket etch-stop layer 18 is deposited on the substrate 10. The etch-stop layer 18 is preferably silicon nitride ($Si_3N_4$) and is deposited by low-pressure CVD using a reactant gas mixture such as silane ($SiH_4$) and ammonia ($NH_3$). The etch-stop layer 18 is deposited to a thickness of between about 100 and 400 Angstroms. A disposable first insulating layer 20 is deposited. Layer 20 is preferably $SiO_2$, deposited by low-pressure CVD using a reactant gas such as tetraethosiloxane (TEOS). The $SiO_2$ layer 20 is deposited to a thickness that determines the height of the DRAM capacitor bottom electrodes, and more specifically to a thickness in the range of 6000 to 12000 Angstroms. Using a photoresist mask (not shown) and anisotropic plasma etching, first contact openings 1 are etched in the first insulating layer 20 and the etch-stop layer 18 to the device areas in the memory regions for the array of memory cells. The first contact openings 1 are etched using reactive ion etching and an etchant gas mixture containing $CF_4$, $SF_6$, $CHF_3$, or $C_4F_8$, which etches the $SiO_2$ selectively to the $Si_3N_4$, and then the forming the openings 1, N-doped regions 19 are formed in the exposed substrate in the openings 1, for example, by implanting ions ($p^{31}$) to a preferred concentration of between about 1.0 E 18 and 1.0 E 19 atoms/cm$^3$.

Figure 3:
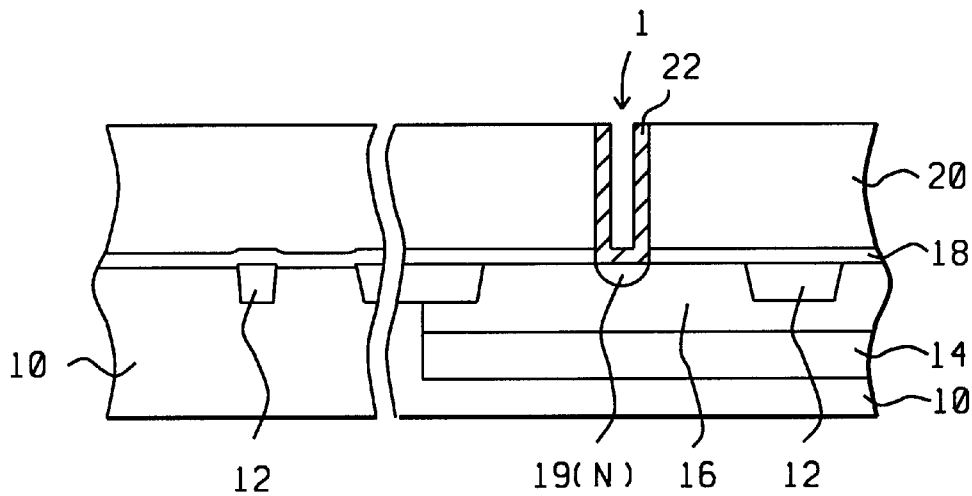

Referring to FIG. 3, capacitor bottom electrodes are formed in the first openings 1 by depositing a conformal first polysilicon layer 22. Layer 22 is deposited by LPCVD using $SiH_4$ as the reactant gas, and is deposited to a thickness of between about 200 and 800 Angstroms. The first polysilicon layer 22 is then chemically-mechanically polished back to the surface of the first insulating layer 20 to form the capacitor bottom electrodes 22 in the openings 1, as shown in FIG. 3. The polysilicon layer 22 is typically undoped: however, the prior implant step for the diffused region 19(N) can be omitted and a phosphorus-doped first polysilicon layer can be deposited and used as a solid-state diffusion source for forming the diffused regions 19(N).

Figure 4:
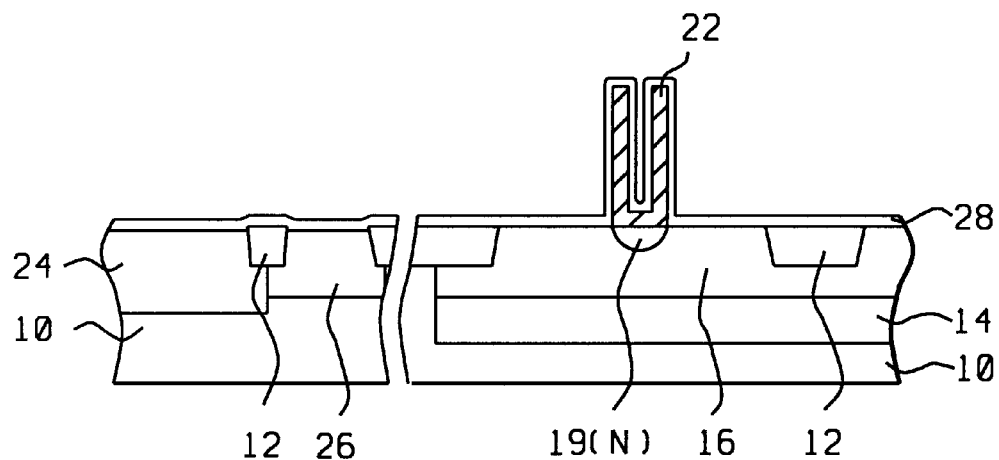

Referring next to FIG. 4, the disposable first insulating layer 20 is selectively removed to the etch-stop layer 18 using a wet etch, for example, a hydrofluoric (RF) acid solution. This etching results in free-standing cylindrical-shaped capacitor bottom electrodes 22. The height of the capacitor and therefore the area of the capacitor is determined by the thickness of the disposable first insulating-layer 20. Next the Si$_3$N$_4$ etch-stop layer 18 is selectively removed from the substrate surface using, for example, a hot phosphoric acid etching solution typically at a temperature of about 165° C., Continuing with FIG. 4, N-doped wells 24 are implanted in the logic region for P-channel FETs and P-doped wells 26 are then implanted in the device areas of the logic region for N-channel FETs using appropriate implant blockout masks (not shown). Typically the N-doped wells 24 are doped with P$^{31}$ to a concentration of between about 1.0 E 16 and 1.0 E 17 atoms/cm$^3$, and the P-doped wells 26 are doped with B$^{11}$ to a concentration of between about 1.0 E 16 and 1.0 E 17 atoms/cm$^3$. During the N- and P-well implants, appropriate threshold voltages V$_t$ and appropriate antipunchthrough implants are also carried out to prevent punchthrough between FET source and drain areas.

Still referring to FIG. 4 and a key feature of this invention is to deposit a conformal dielectric layer 28 on the substrate to form the gate oxide for the FETs and concurrently to form an interelectrode dielectric layer on the capacitor bottom electrodes 22. The gate oxide and the interelectrode dielectric layer 28 are preferably composed of silicon oxynitride (SiON), tantalum pentoxide (Ta$_2$O$_5$), or other insulating materials having a high-dielectric constant (k). Layer 28 is preferably very thin to provide faster switching speeds for the FETs and higher capacitance for the DRAM capacitors, and to a preferred thickness of about 20 to 150 Angstroms for SiON, and to a preferred thickness of about 30 to 200 Angstroms for Ta$_2$O$_5$. The SiON can be formed by CVD using a reactant gas mixture such as silane (SiH$_4$) and ammonia (NH$_3$), and the Ta$_2$O$_5$ can be formed by CVD.

Figure 5:
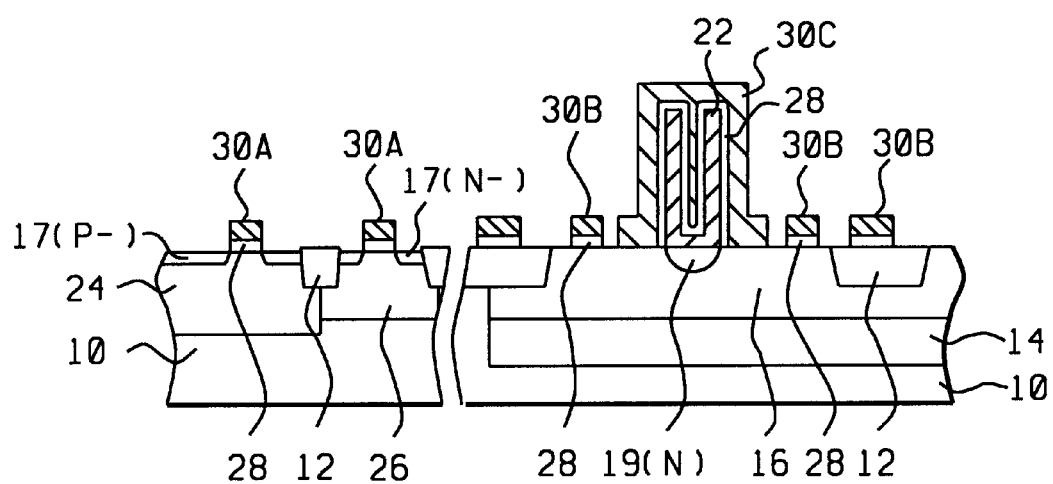

Referring to FIG. 5, a conformal second poly-silicon layer 30 is deposited. Polysilicon layer 30 is undoped and is deposited by LPCVD to a thickness of between about 500 and 2000 Angstroms. Using a photoresist mask and anisotropic plasma etching, the second polysilicon layer 30 is patterned to form FET gate electrodes 30A for the logic FETs, to define the FET gate electrodes 30B for the DRAM cells, and to form the capacitor top electrodes 30C over the capacitor bottom electrodes. The plasma etching can be carried out in a reactive ion etcher using a gas that contains chlorine. Appropriate implant masks are used to implant the lightly doped source/drain areas 17(P$^-$) for the P-channel FETs and 17(N$^-$) for the N-channel FETs. The lightly doped drains are typically doped with phosphorus for N-channel FETs and with boron for P-channel FETs to a concentration of between about 1.0 E 17 and 1.0 E 18 atoms/cm$^3$. The lightly doped source/drain areas 17 are formed adjacent to the gate electrodes 30A in the logic regions. An additional block-out mask can be used to form lightly doped source/drain areas 15(N) for the FETs in the DRAM regions.

Figure 6:
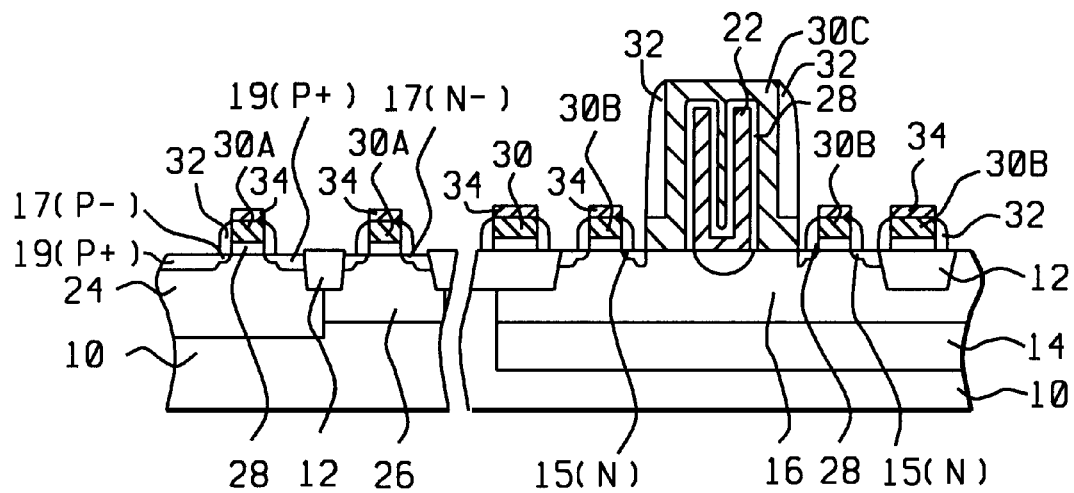

Referring to FIG. 6, sidewall spacers 32 are formed on the sidewalls on the gate electrodes 30A and 30B. The sidewall spacers 32 are formed by depositing a conformal insulating layer 32. Layer 32 can be a SiO$_2$, or a multilayer composed of SiO$_2$ and Si$_3$N$_4$. The insulating layer 32 is anisotropically etched back to the top surface of the patterned second polysilicon layer 30 to form the sidewall spacers, also labeled 32. Then the FET source/drain contact areas 19(P$^+$) and 19(N$^+$) for the P-channel and the N-channel FETs, respectively, are formed in the logic areas by using appropriate implant block-out masks (not shown) and ion implantation. Also, the implants for the source/drain areas are used at the same time to dope the polysilicon gate electrodes 30A. Preferably p$^{31}$ and B$^{11}$ implants are used to dope the source/drain contacts 19(N$^+$) and 19(P$^+$), respectively, and are doped to a concentration of between about 1.0 E 19 and 1.0 E 20 atoms/cm$^3$.

Another key feature is that the lightly doped source/drain areas and source/drain contact areas are implanted after completing the capacitor, and therefore the thermal cycles for the FETs are drastically reduced. This results in forming high-performance FETs with very shallow diffused source/drain junctions.

Still referring to FIG. 6, a salicide process is carried out to improve electrical conductivity. This is achieved by depositing a thin refractory metal layer, such as titanium (Ti). The Ti is deposited by physical vapor deposition, such as by sputtering from a Ti target in a sputter tool. The Ti layer is deposited to a preferred thickness of between about 200 and 400 Angstroms. Using a first rapid thermal anneal, the substrate is heated at a temperature of about 600 to 800° C. for about 20 to 50 seconds to react the Ti with the exposed polysilicon 30 and the silicon substrate's source/drain areas to form a TiSi$_x$ 34, while the Ti over the insulating surfaces remains unreacted. The unreacted Ti is then removed selectively by etching in NH$_4$OH and H$_2$O$_2$ A second thermal anneal is carried out at a temperature of about 700 to 900° C. for about 20 to 50 seconds to complete the TiSi$_x$ phase transition to form TiSi$_2$ and thereby reducing resistance of the polysilicon 30 and improving the contact resistance of the source/drain contact areas 19(P$^+$) and 19(N$^+$). The TiSi$_2$ is not depicted on the source/drain contact areas 19 to simplify the drawings.

Figure 7:
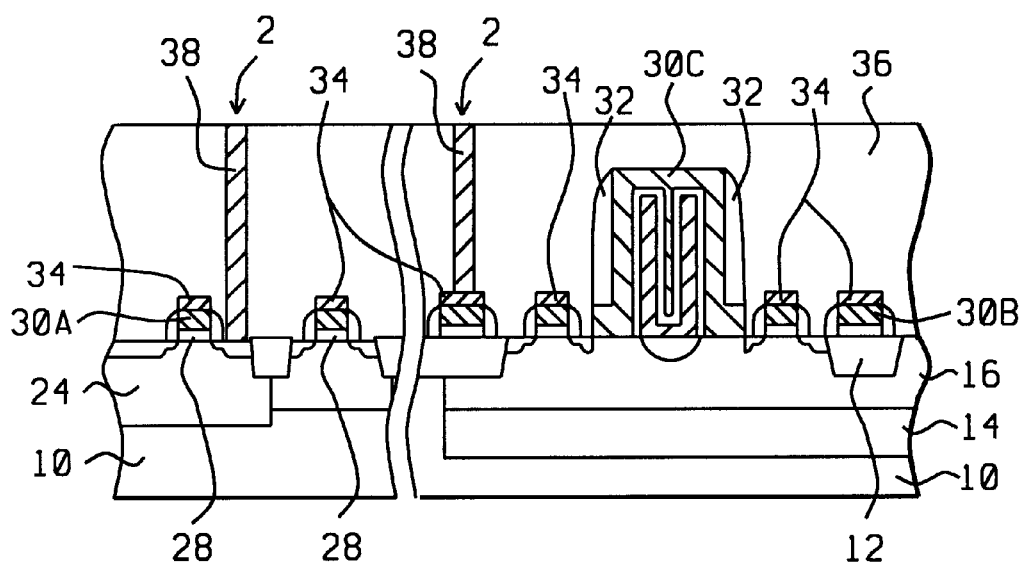

Referring to FIG. 7, a second insulating layer is deposited and planarized to form an interlevel dielectric layer 36. Preferably layer 36 is a SiO$_2$ deposited. by a low-temperature deposition process such as plasma-enhanced CVD. The SiO$_2$ layer 36 is planarized by a low-temperature process such as by chemical-mechanical polishing. The second insulating layer 36 is planarized to a preferred thickness that is sufficient to protect the capacitor, and more specifically to a thickness of between about 8000 and 15000 Angstroms. Second contact openings 2 are etched in the second insulating layer 36 to the substrate 10, which include the contact openings to the FET gate electrodes 30A and 30B, and to the source/drain contact areas 19(N$^+$) and 19(P$^+$). The second contact openings 2 can be etched using conventional photolithographic techniques and anisotropic plasma etching. Metal plug contacts 38, such as tungsten, are formed in the second openings 2. For example, the metal plugs can be formed by depositing a CVD tungsten and chemically-mechanically polishing back to the second insulating layer 36.

After completing this novel structure, conventional processing is used to form the multilevels of metal interconnections (not shown) necessary to complete the logic/embedded DRAM integrated circuits.

While the invention has been particularly shown and described with reference to the preferred embodiment thereof, it will be understood by those skilled in the art that various changes in form and details may be made without departing from the spirit and scope of the invention.

What is claimed is:

1. A method for fabricating embedded dynamic random access memory (DRAM) circuits with logic integrated semiconductor circuits comprising the steps of:

providing a semiconductor substrate having logic regions and memory regions having device areas, said device areas surrounded and electrically isolated from each other by field oxide areas;

forming P-doped wells and deep N-doped wells in said memory regions' device areas;

depositing an etch-stop layer, and forming a planar first insulating layer thereon;

etching first contact openings in said first insulating layer and said etch-stop layer to said device areas in said memory regions for capacitor bottom electrodes;

depositing a conformal first polysilicon layer and polishing back to said first insulating layer to form capacitor bottom electrodes in said first contact openings;

removing selectively said first insulating layer to said etch-stop layer;

removing selectively said etch-stop layer to said substrate;

implanting N-doped wells and P-doped wells in said device areas of said logic regions:

depositing a conformal dielectric layer to form a gate oxide for FETs and concurrently to form an interelectrode dielectric layer over said capacitor bottom electrodes;

depositing a conformal second polysilicon layer;

patterning said second polysilicon layer to form gate electrodes for said FETs and to form capacitor top electrodes over said capacitor bottom electrodes;

forming lightly doped source/drain areas by ion implantation;

forming sidewall spacers on said gate electrodes;

forming source/drain contact areas by ion implantation adjacent to said sidewall spacers;

carrying out a salicide process to form a silicide on said gate electrodes and on said source/drain contact areas;

depositing and planarizing a second insulating layer;

etching second contact openings in said second insulating layer and forming a multilevel of metal interconnections to complete said logic integrated semiconductor circuits with said embedded DRAM circuits.

2. The method of claim 1, wherein said semiconductor substrate is single-crystal silicon and said P-doped wells in said memory regions are formed by implanting boron ions and said N-doped wells in said memory regions are formed by implanting phosphorus ions.

3. The method of claim 1, wherein said etch-stop layer is silicon nitride deposited to a thickness of between about 100 and 400 Angstroms.

4. The method of claim 1, wherein said first insulating layer is a chemical-vapor-deposited silicon oxide deposited to a thickness of between about 6000 and 12000 Angstroms.

5. The method of claim 1, wherein said first polysilicon layer is deposited by chemical vapor deposition to a thickness of between about 200 and 800 Angstroms.

6. The method of claim 1, wherein said first insulating layer is removed selectively to said etch-stop layer using a hydrofluoric acid solution.

7. The method of claim 1, wherein said etch-stop layer is selectively removed using a hot phosphoric acid etch.

8. The method of claim 1, wherein said P-doped wells in said logic regions are formed by implanting boron ions and said N-doped wells in said logic regions are formed by implanting phosphorus ions, and where said implants include antipunchthrough implants.

9. The method of claim 1, wherein said conformal dielectric layer is a high-dielectric-constant material composed of silicon oxynitride and is formed to a thickness of between about 20 and 150 Angstroms.

10. The method of claim 1, wherein said conformal dielectric layer is a high-dielectric-constant material composed of tantalum pentoxide and is formed to a thickness of between about 30 and 200 Angstroms.

11. The method of claim 1, wherein said second polysilicon layer is deposited by chemical vapor deposition to a thickness of between about 500 and 2000 Angstroms.

12. The method of claim 1, wherein said sidewalls are formed by depositing a conformal insulating layer and anisotropically etching back to the top surface of said gate electrodes.

13. The method of claim 1, wherein said salicide process is carried out by depositing a refractory metal layer and annealing to form said silicide on said gate electrodes and on said source/drain contact areas, and removing unreacted portions of said refractory metal on any insulating surfaces.

14. The method of claim 1, wherein said second insulating layer is a chemical-vapor-deposited silicon oxide deposited to a thickness of between about 8000 and 15000 Angstroms, and where said second contact openings are filled with a metal.

* * * * *